United States Patent [19]

Silagi et al.

[11] Patent Number: 4,595,882
[45] Date of Patent: Jun. 17, 1986

[54] PHASE ADJUSTED FEEDFORWARD ERROR CORRECTION

[75] Inventors: Edward G. Silagi; Marvin W. Heidt, both of Cedar Rapids, Iowa

[73] Assignee: Rockwell International Corporation, El Segundo, Calif.

[21] Appl. No.: 615,500

[22] Filed: May 30, 1984

[51] Int. Cl.[4] ............................................. H03F 1/26
[52] U.S. Cl. .................................. 330/151; 330/149; 330/304
[58] Field of Search ....................... 330/149, 151, 304; 328/162

[56] References Cited

FOREIGN PATENT DOCUMENTS 2656436  6/1978  Fed. Rep. of Germany ...... 330/151

Primary Examiner—James B. Mullins
Assistant Examiner—G. Wan
Attorney, Agent, or Firm—George A. Montanye; H. Fredrick Hamann

[57] ABSTRACT

There is disclosed a phase adjusted feedforward error correction system with improved linearity and bandwidth for use in high frequency systems. The feedforward system includes phase and amplitude equalizer circuits which cause a main amplifier output signal to be equal in amplitude and phase with the input signal and a second phase and amplitude equalizer circuit which causes the distortion products generated by the main amplifier to be equal in amplitude and phase with the distortion products from the main amplifier output before subtracting the distortion products from the main amplifier output signal. The phase and amplitude equalizer circuits simplify the construction of the feedforward circuit while maintaining inherent stability over the bandwidth and frequency of operation.

6 Claims, 2 Drawing Figures

PHASE ADJUSTED FEEDFORWARD ERROR CORRECTION

BACKGROUND OF THE INVENTION

The present invention relates to amplifiers and more particularly to high power, high frequency amplifiers employing feedforward control for improved stability.

High power amplifiers for use in communications and other environments are requiring improved performance in terms of power amplifier linearity and bandwidth. While certain high performance systems presently utilize vacuum tube technology, the same is not compatible with changing communications environments requiring solid state power amplifier designs to reduce size, weight and cost as well as to allow greater network simplicity and improved reliability. However, before such conventional vacuum tube systems can be replaced with solid state designs, there must be significant improvements in the characteristics of such solid state amplifier circuits in terms of improvements in intermodulation distortion and transmitted noise performance.

By way of example, current linear power amplifiers constructed for use in high frequency environments have limited performance because of device non-linearities. In particular, such non-linearities introduce distortion into the output of the power amplifier and some technique must be used to reduce intermodulation distortion to acceptable levels before the linear power amplifiers will attain high versatility. Accordingly, two known methods of reducing such intermodulation distortion include feedback and feedforward techniques.

As is known in the art, both of the above methods have inherent drawbacks which limit their applicability to linear power amplifiers. Specifically, in the case of feedback systems, the greatest problem in implementing the amplifier is in maintaining its stability under a variety of operating conditions. More particularly, because a feedback system is correcting for an error that has already occurred in an earlier timeframe, acceptable results can only be achieved at the expense of increased gain and bandwidth requirements. Such circuits therefore sacrifice efficiency and bandwidth to achieve distortion reduction for use in high power and high frequency systems.

In other instances, the intermodulation distortion problem has been addressed by using a feedforward concept. This concept is well known and is described in such U.S. Pat. Nos. as 1,686,792; 2,102,671; 3,471,798; and more recently in U.S. Pat. No. 4,352,072, assigned to the same assignee as the present invention, each of which is incorporated by reference herein in its entirety. The operation of such circuits to reduce intermodulation distortion and provide improved stability, as well as the elements used to implement such systems, is clearly referenced in the above-identified patents and additionally in the article entitled "Feedforward—An Alternative Approach to Amplifier Linearization" by T. J. Bennett and R. F. Clements in the *Radio and Electronic Engineer*, Vol. 44, No. 5, May 1974. Such systems apply error correction without feedback and accordingly provide improved linearity by compensating in the same timeframe that any distortion within the amplifier is created.

In such feedforward systems, the error correction is accomplished by sampling the distorted output from the main amplifier and removing the undistorted input from that output through a hybrid junction. The resulting output from the hybrid junction then includes only the distortion products created by the main amplifier. The level of the distortion products is then raised to an appropriate level by an error amplifier and subtracted from the main amplifier output by an injection coupler. The result is an output signal amplified by the main amplifier with the distortion products subtracted from that main amplifier output during the same timeframe. In operation, the signal delays in all parallel paths are equalized by the use of phase equalizers and coaxial lengths having the same delay characteristics in both the main amplifier and error amplifier loops. This thus removes the distortion products in the same timeframe that the distortion is created without requiring direct feedback paths which would render the system unstable under varying operating conditions.

While such feedforward systems as are described in the prior art provide improved performance at low power levels, the same have limitations when implemented in systems to be used at higher power levels. Such problems are basically caused by the delays encountered resulting from the multiple stage amplification of the main and error amplifiers, and the phase and amplitude linearity requirements over frequency for the main and error amplifiers. In particular, the delay lines used in such prior art feedforward systems take the form of lengths of coaxial cable which typically may be constructed as a thirty-foot length of RG-213 coax. This cable will produce a 30 watt loss in a 500 watt system and proves to be bulky and space-consuming, contrary to the requirements of current communications equipment. Furthermore, in order to maintain phase and amplitude linearity over frequency, high power phase equalizers of increased complexity in design and implementation must be used. This tends to be expensive and complex and reduces the overall desirability of such high power systems requiring phase equalization.

Accordingly, the present invention has been developed to overcome the specific shortcomings of the above known and similar techniques and to provide a phase adjusted feedforward error correction circuit for use with high power, high frequency linear power amplifiers.

SUMMARY OF THE INVENTION

In accordance with the present invention, an RF input is coupled through an input coupler to provide a main signal path and a sample signal of the input signal. The signal on the main signal path is coupled through phase and amplitude equalizers and through a main amplifier to provide a main amplifier output signal. A second coupler samples the output signal to provide an output sample, which has been forced by the aforementioned phase and amplitude equalizers to be equal in amplitude and phase with the input sample. This adjuted output sample is combined with the input sample in a hybrid junction to produce a correction signal representing the distortion products generated by the main amplifier. The correction signal is coupled through phase and amplitude equalizers to force the correction signal to be equal in amplitude and phase with the distortion products from the main amplifier and thereafter amplified by an error amplifier. The output from the error amplifier is then subtracted from the main amplifier output signal through an injection coupler to linearize the output.

It is therefore a feature of the invention to provide an improved phase adjusted feedforward circuit.

It is a further feature of the invention to provide a phase adjusted feedforward error correction circuit having a less complex construction and improved reliability.

It is yet another feature of the invention to provide a feedforward circuit for use in power amplification at high frequencies which provides linear amplification with improved power efficiency over the frequency range of operation.

Still another feature of the invention is to provide a phase adjusted feedforward error correction circuit in a high power amplifier which eliminates the necessity for coaxial delay lines.

Still a further feature of the invention is to provide a phase adjusted feedforward error correction circuit in a high power, high frequency power amplifier which includes phase and amplitude equalization in small signal paths which may implemented with low power, space-saving devices.

These and other advantages and novel features of the invention will become apparent from the following detailed description when considered with the accompanying drawings wherein:

DETAILED DESCRIPTION OF A PREFERRED EMBODIMENT

Figure 1:
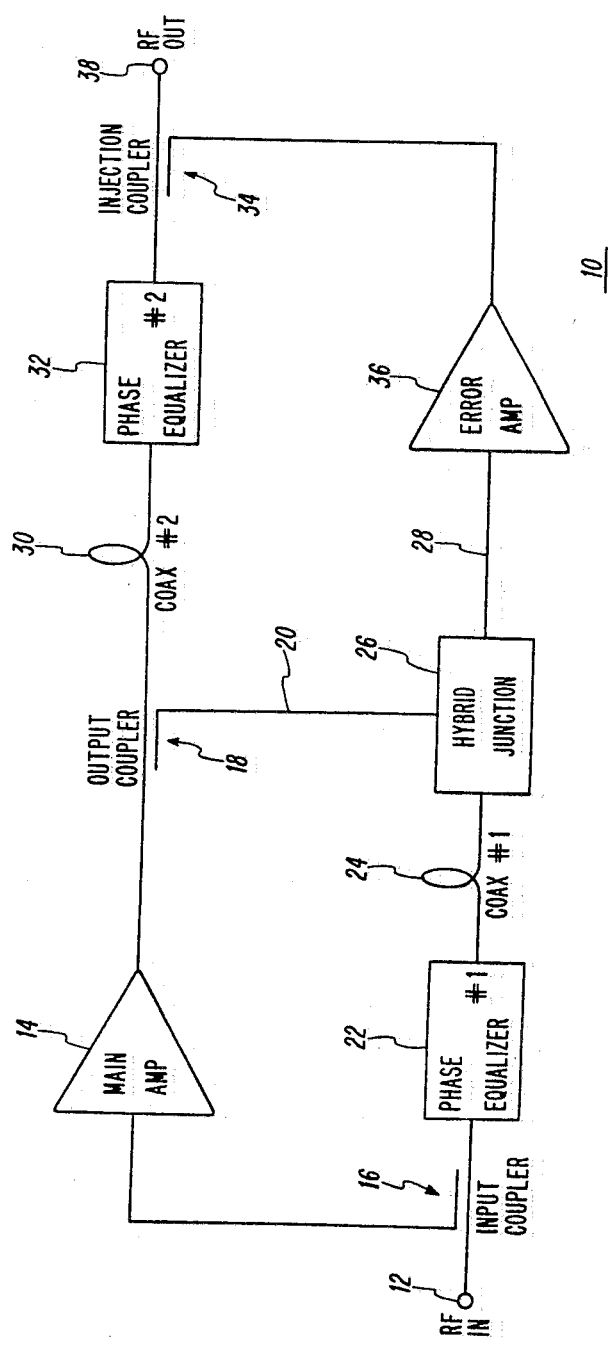
FIG. 1 is a schematic diagram showing a generic feedforward system known in the prior art.

Referring now to the drawings, wherein like numerals are used to refer to like elements throughout, there is shown a feedforward correction circuit used in connection with a high power amplifier system as is known in the prior art. This feedforward system 10 includes an input for receiving radio frequency (RF) energy over the frequency spectrum of use and may include the high frequency (HF) range of radio frequency energy. The RF input (generally a carrier modulated by an information signal) is provided to terminal 12 as the fundamental input signal (desired signal) which is coupled to the main power amplifier 14. The RF input from terminal 12 is also sampled by an input coupler 16 to provide a sample of the input signal in a conventional manner. Such input coupler may be a conventional 3 dB coupler for providing a sample of the input signal. The output from the main amplifier 14 is coupled to an output coupler 18 which provides the amplified desired output signal and allows a sample of that output signal to be made from the output coupler 18 over line 20. Again, the output coupler may be a conventional coupler such as a 10 dB coupler of conventional construction.

The sample of the input signal from coupler 16 is coupled through a phase equalizer 22 and a length of coaxial cable 24 to one input of a conventional hybrid junction 26. Likewise, the sampled output signal on line 20 is coupled as a second input to that same hybrid junction 26 so that the output sample on line 20 and the input sample from coupler 16 are subtracted in the hybrid junction 26 to provide a difference output on the line 28 representing distortion products produced by the main amplifier 14 as will be described below. The amplified output signal through coupler 18 is coupled through a second length of coaxial cable 30 and through a second phase equalizer 32 of conventional construction and thence provided to a conventional injection coupler 34. The difference signal representing the distortion products as an error signal on line 28 is amplified through error amplifier 36 and provided as one input to the injection coupler 34 where it is subtracted from the amplified output signal to produce a main amplifier output 38 with intermodulation products removed.

The above conventional system operates in a known manner to subtract an output sample on line 20, which includes an amplified input signal plus intermodulation products produced by the main amplifier 14, from an undistorted input signal represented by the input sample from coupler 16 so that the output on line 28 from the hybrid junction 26 is only a signal representing the distortion products created by the main amplifier 14. The distortion products created by the main amplifier 14 and represented by the correction signal on line 28 is amplified to an appropriate level by the amplifier 36 and subtracted from the main amplifier output through the injection coupler 34. The result is an output signal amplified by the main amplifier 14 with the distortion products created by the main amplifier 14 removed.

As will be appreciated, signal delays in the above system are equalized by the use of phase equalizer 22 and coax 24 which have the same delay characteristics as the main amplifier signal path which includes main amplifier 14, output coupler 18 and line 20. Likewise, signal delays in the above system are equalized by the use of phase equalizer 32 and coax 30 which have the same delay characteristics as the error amplifier signal path which includes line 20, hybrid junction 26, line 28 and error amplifier 36. Since all main and error signals are thus delayed equally, the subtraction in the injection coupler 34 produces distortion removal which takes place in the same timeframe as the distortion is created. Thus, the feedforward signal acts to remove distortion without the requirement for feedback, thereby resulting in an unconditionally stable system under normal operating conditions.

As was noted above, because of delays encountered from the multiple stage amplification of the main and error amplifiers 14 and 36, the delay lines formed by coax cables 24 and 30 tend to be bulky and power consuming. Typically, the coax delay lines 24 and 30 are formed as 30-foot lengths of RG-213 coaxial cable which has a loss of about 30 watts in a 500 watt system. In addition to being bulky and space-consuming, this significant power drain is prohibitive at the high power levels required for high frequency systems. Furthermore, the system of FIG. 1 requires the main and error amplifiers to be substantially linear in phase and amplitude over frequency in order to operate over the frequency range of the system. If such linear phase and amplitude is not maintained, the phase equalizers 22 and 32 must compensate for the non-linearities, thereby necessitating structures which become increasingly complex in design and implementation.

Figure 2:
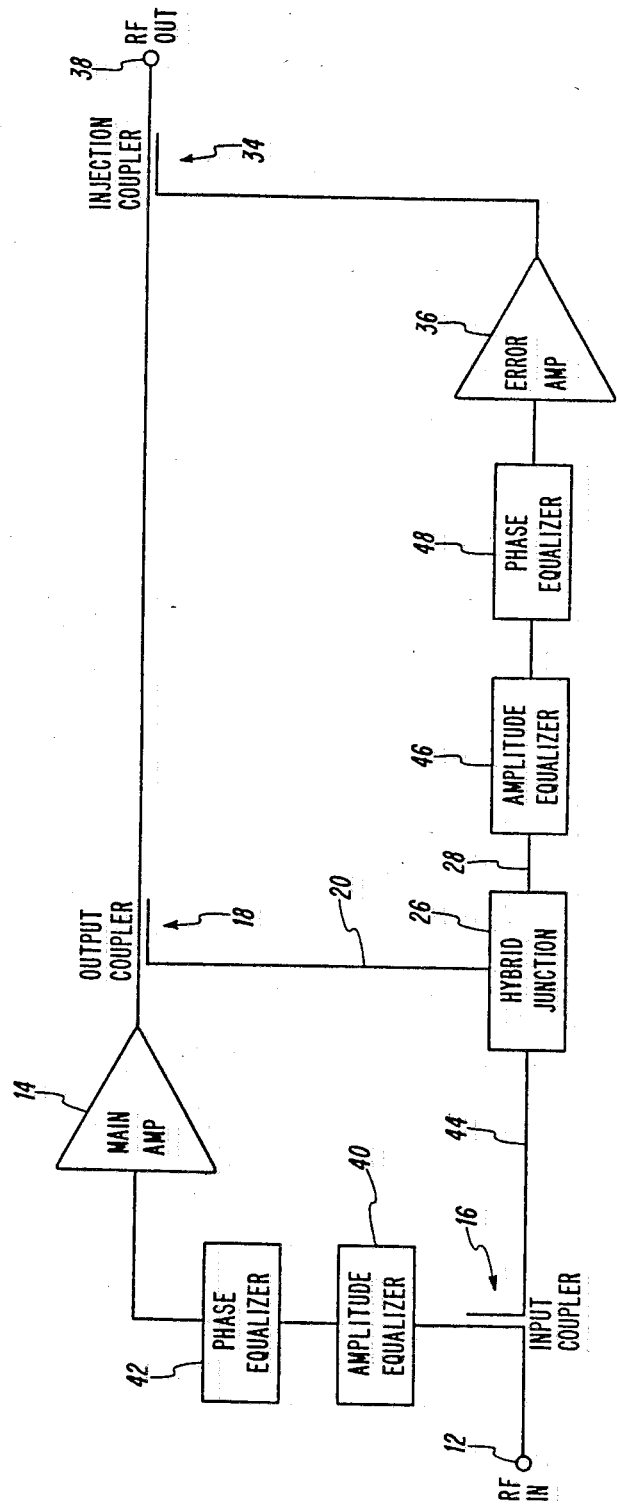
FIG. 2 is a schematic diagram showing the phase adjusted feedforward system of the present invention.

Contrary to the above prior art system, the present invention reduces the complexity of this system while still providing feedforward control having inherent stability and conventional bandwidth characteristics. Referring now to FIG. 2, there is shown an embodiment of the invention incorporating the phase adjusted feedforward error correction technique. More specifically, RF is again coupled to an input terminal 12 and through an input coupler 16 to provide a main input signal and a sampled input signal. The main input signal is coupled through an amplitude equalizer 40 and a phase equalizer 42 and thence through a main amplifier 14 to one terminal of an output coupler 18. The sampled output from output coupler 18 is provided on line 20 to one terminal of the hybrid junction 26 while the sampled input signal from input coupler 16 is provided over line 44 to a second terminal of the hybrid junction 26. The main amplifier output signal from output coupler 18 is coupled to one terminal of an injection coupler 34 which in turn provides its output as the RF output 38. The error correction signal from line 28 is coupled through an amplitude equalizer 46 and thence through a phase equalizer 48 and error amplifier 36 to provide the amplified error correction signal to a terminal of the injection coupler 34 for subtracting distortion from the main amplifier output signal in the injection coupler 34.

In accordance with the circuit shown in FIG. 2, the fundamental (desired) signal of the main amplifier 14 is produced by amplifying the RF input signal at terminal 12, after phase and amplitude equalization through elements 40 and 42. The sample of this main amplifier output signal, which is taken by output coupler 18 and which exists on line 20, is forced to be equal in amplitude and phase with the input sample on line 44 by those elements 40 and 42. Likewise, as in the system shown in FIG. 1, the hybrid junction removes the fundamental signal from the output sample by subtracting the input sample on line 44 from the output sample on line 20 in the hybrid junction 26 to produce a correction signal on line 28 which is only the distortion products generated by the main amplifier 14. The products represented by this correction signal on line 28 are then forced to be equal in amplitude and phase with the distortion products out of the main amplifier 14 by amplitude equalizer 46 and phase equalizer 48 and the error amplifier 36. The phase and amplitude equalized correction signal is then subtracted from the main amplifier output signal in the injection coupler 34 to produce an amplified output 38 of the input signal at terminal 12 without the intermodulation products introduced by main amplifier 14.

In accordance with the above, the amplitude equalizers 40 and 46 may be of any conventional construction such as RF attenuators known in the prior art. Likewise, the phase equalizers 42 and 48 may be constructed using the phase shift network described in the co-pending application entitled "Phase Shift Network with Minimum Amplitude Ripple", filed on even date herewith and assigned to the same assignee, which application is hereby incorporated by reference in its entirety, or in any known manner capable of producing the required phase equalization of the input and correction signal. With respect to each of the other elements referenced that are common to the circuit of FIG. 1, the same may also be constructed in accordance with those techniques known in the prior art with specific reference being made to U.S. Pat. No. 4,352,072 and the aforementioned article in the *Radio and Electronic Engineer*.

In operation, the above system is inherently more stable than a conventional feedback system and therefore operates more efficiently without the requirement for the substantial gain and bandwidth needed to effect distortion reduction in accordance with prior art feedback systems. It should be noted, however, that in contrast to the circuit of FIG. 1, the correction in accordance with the present invention is not being made in the same timeframe as that in which distortion has taken place. As a result, the correction is being made on a succeeding RF cycle (similar to feedback operation) and therefore causes the circuit to become less effective as the modulation frequency of the RF carrier approaches the carrier frequency. In addition, this phase adjusted feedforward system will also lack the instantaneous bandwidth of a conventional feedforward system.

However, the above is more than offset by the use of phase and amplitude equalization wherein that equalization is performed in the small signal paths of the feedforward system. Specifically, amplitude and phase equalizers 40 and 42 act on the unamplified RF input signal at terminal 12 while the amplitude and phase equalizers 46 and 48 operate on a low amplitude correction signal from the hybrid junction 26. Thus, the losses in the main output path as a result of the coax cable 30 used in connection with FIG. 1, is eliminated. In addition, because the equalizers are coupled in small signal paths, they may be built with low power space-saving components, thereby leading to increased savings in cost while reducing complexity and improving reliability. Furthermore, because the phase shift requirements for the phase equalizers necessitate decreasing the phase shift with increasing frequency, the phase equalizers have to be actively controlled in accordance with the frequency of operation of the feedforward system. While this may be accomplished with conventional low power solid state components, this same control reduces the strict requirements previously needed in amplifiers 14 and 36. Specifically, since the phase equalizers 42 and 48 have to be controlled at each frequency, their control can be used to compensate for phase and amplitude linearity problems in the main amplifiers 14 and 36 to thereby linearize the operation of those signal paths. This allows the main and error amplifiers 14 and 36 to be implemented without the stringent phase and amplitude linearity requirements conventionally required for common feedforward systems. As a result, the main and error amplifiers may be more easily implemented with conventional solid state components.

As can be seen from the above, the present invention provides an improved phase adjusted feedforward system for providing an amplified RF signal with reduced intermodulation products. The system employs phase and amplitude equalization in the small signal paths of the feedforward system to eliminate the need for complex high power phase equalizers and eliminate high power dissipation in the main amplifier output. The system may be implemented with low power, low cost and more simplified components than that conventionally used in feedforward systems while still producing an inherently stable output. The distortion reduction is achieved for use in high power, high frequency applications to maintain amplifier linearity and bandwidth. These are all features which are not shown or suggested in the prior art.

Although the invention has been described with specific reference to particular structures forming the individual elements of the system, it will be apparent that other equivalent elements and components could be employed. Thus, while 3 dB couplers have been referred to in connection with input and output couplers 16 and 18, any other couplers consistent with the operation of the circuit could be used. Likewise, the specific construction of the injection coupler 34 and each of the remaining elements can be selected from a variety of common structures capable of implementing the functions described. Such would thus include those mentioned in the prior art references cited herein as well as others known in the prior art.

Obviously many other modifications and variations of the present invention are possible in light of the above teachings. It is therefore to be understood that within the scope of the appended claims, the invention may be practiced otherwise than as specifically described.

What is claimed is:

1. A phase adjusted feedforward amplifier system comprising:
   means for receiving an input signal;
   means for amplifying said input signal to provide an amplified output signal;
   means for sampling said input signal and providing a sampled input signal;
   means for phase and amplitude equalizing said input signal so that said amplified output signal is equal in amplitude and phase with said sampled input signal;
   means for sampling said amplified output signal to provide a sampled output signal;
   means for subtracting said sampled input signal from said sampled output signal to provide a correction signal;
   means for amplifying said correction signal to provide an amplified correction signal;
   means for phase and amplitude equalizing said correction signal so that said amplified correction signal is equal in phase and amplitude to said amplified output signal; and
   means for subtracting said amplified correction signal from said amplified output signal to produce an amplified output of said input signal.

2. The system of claim 1 wherein said means for phase and amplitude equalizing comprise an amplitude equalizer and a phase equalizer.

3. The system of claim 1 wherein said means for subtracting comprises a hybrid junction.

4. The system of claim 1 wherein said means for subtracting said amplified correction signal from said amplified output signal comprises an injection coupler.

5. The system of claim 3 wherein said hybrid junction is a 3 dB hybrid lossless coupler.

6. The system of claim 1 further including means for adjusting said means for phase and amplitude equalizing in accordance with the frequency of said input signal.

* * * * *